(12) United States Patent
Lee et al.

(10) Patent No.: US 12,133,377 B2
(45) Date of Patent: Oct. 29, 2024

(54) BIT CELL STRUCTURE FOR ONE-TIME-PROGRAMMING

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW); Chi-Horn Pai, Tainan (TW); Chih-Kai Kang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 607 days.

(21) Appl. No.: 17/320,234

(22) Filed: May 14, 2021

(65) Prior Publication Data
US 2022/0328504 A1 Oct. 13, 2022

(30) Foreign Application Priority Data
Apr. 8, 2021 (CN) .......................... 202110376168.2

(51) Int. Cl.
*H10B 20/20* (2023.01)
*G11C 17/16* (2006.01)

(52) U.S. Cl.
CPC ............. *H10B 20/20* (2023.02); *G11C 17/16* (2013.01)

(58) Field of Classification Search
CPC ............................... H10B 20/20; H10B 20/387
See application file for complete search history.

(56) References Cited

U.S. PATENT DOCUMENTS

| 7,567,449 | B2 | 7/2009 | Paak | |
|---|---|---|---|---|
| 10,127,998 | B2 | 11/2018 | Hoefler | |
| 2009/0034316 | A1* | 2/2009 | Yamada | H10B 20/00 365/104 |
| 2010/0265755 | A1* | 10/2010 | Ching | H10B 20/00 257/288 |

* cited by examiner

*Primary Examiner* — Kevin Parendo
(74) *Attorney, Agent, or Firm* — Winston Hsu

(57) ABSTRACT

A bit cell structure for one-time programming is provided in the present invention, including a substrate, a first doped region in the substrate and electrically connecting a source line, a second doped region in the substrate and having a source and a drain electrically connecting a bit line, a heavily-doped channel in the substrate and connecting the first doped region and the source of second doped region, and a word line crossing over the second dope region between the source and the drain.

8 Claims, 6 Drawing Sheets

BIT CELL STRUCTURE FOR ONE-TIME-PROGRAMMING

BACKGROUND OF THE INVENTION

1. Field of the Invention

The present invention generally relatives to a bit cell structure for one-time-programming, and more specifically, to a bit cell structure with heavily doped channel region for one-time-programming.

2. Description of the Prior Art

One-time-programmable (OTP) memory elements are used in integrated circuits (IC) to provide non-volatile memory (NVM). Data in NVM are not lost when the IC is turned off. NVM allows an IC manufacturer to store lot number and security data on the IC, for example, and is useful in many other applications. Devices commonly known as fuses and anti-fuses are examples of OTP memory elements.

Other types of devices, such as flash memory, are also used to provide NVM in ICs. However, incorporating flash memory in a CMOS IC adds significant cost because extra processing steps are typically required. Many types of fuses exist, such as polysilicon fuses, metal fuses, contact fuses and via fuses, that are compatible with standard CMOS processing.

However, high-density OTP memory is typically less reliable and has a lower programming yield than similarly sized flash memory. It is therefore desirable to provide OTP memory elements with better reliability and yield.

SUMMARY OF THE INVENTION

In the light of the conventional problem that one-time-programmable memory has mediocre reliability and poor yield, the present invention hereby provides a novel bit cell structure specific for one-time-programming, with features of heavily doped channel region and/or particular channel shape to improve the reliability of programming and the performance of devices.

One aspect of the present invention is to provide a bit cell structure for one-time-programming, including a substrate, a first doped region in the substrate and electrically connected with a source line, a second doped region in the substrate and including a source and a drain, wherein the drain is electrically connected with a bit line, a heavily doped channel region in the substrate and connected with the first doped region and the source of second doped region, and a word line traversing over the second doped region and between the source and the drain.

Another aspect of the present invention is to provide a bit cell structure for one-time-programming, including a substrate, a first doped region in the substrate and electrically connected to a source line, a second doped region in the substrate and provided with a source and a drain, wherein the drain is electrically connected with a bit line, a doped channel region in the substrate, wherein the doped channel region is provided with a first part and a second part connecting respectively to the first doped region and the source of second doped region in a first direction, and a width of the first part in a second direction perpendicular to the first direction is less than a width of the second part in the second direction and is less than a width of the first doped region in the second direction, and a word line traversing over the second doped region and between the source and the drain.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
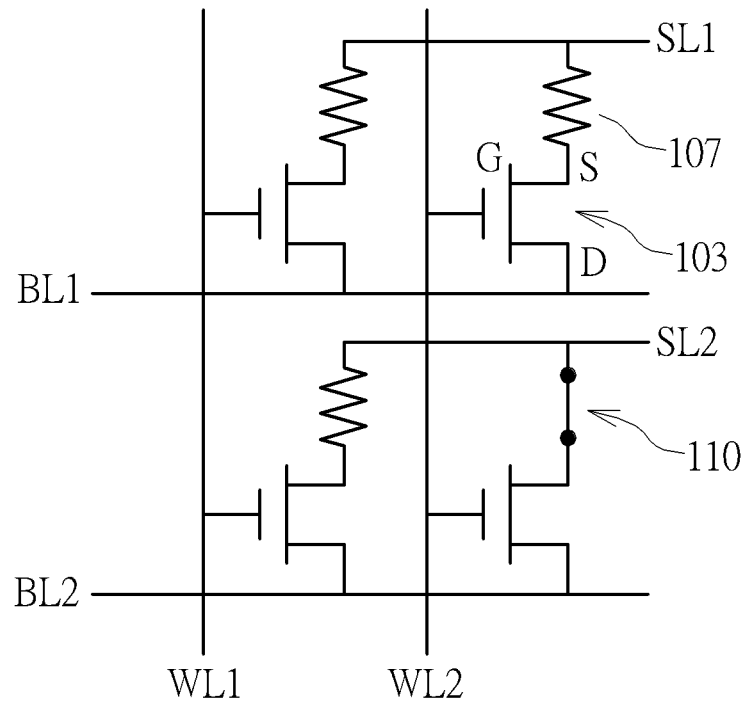
FIG. 1 is a circuit diagram of 2×2 bit cell structure in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

Please refer to FIG. 1, which is a circuit diagram of 2×2 bit cell structure according to the preferred embodiment of present invention. As shown in figure, in the embodiment of present invention, a bit cell structure is composed of a transistor 103 and an anti-fuse 107 (1T1R). The gate G of transistor 103 is electrically connected with one of the word lines WL1, WL2 so that the word line may control the switch of transistor 103. Each word line is electrically connected with the gates of all bit cells in one column to controls their switch. The source S of transistor 103 is electrically connected with an anti-fuse 107, and the anti-fuse 107 is further electrically connected with one of the source lines SL1, SL2 to receive the electronic signal from the source line and transmit it to the transistor 103. Each source line is electrically connected with the anti-fuse 107 of part of or all of the bit cells in one row and transmit signal to them. The drain D of transistor 103 is electrically connected with one of the bit lines BL1, BL2 and transmits electronic signal from the source line to the connected bit line to achieve the reading or writing operation. Please note that in the embodiment of FIG. 1, although the bit lines BL1, BL2 and the source line SL1, SL2 are designedly extend in a first direction D1 and are spaced apart alternatively in a second direction D2 perpendicular to the first direction D1, the source lines SL1, SL2 may be designedly parallel to the word lines WL1, WL2 extending in the second direction D2 and are spaced apart alternatively with the word lines WL1, WL2 in the first direction D1. Furthermore, please note that what the present invention uses is antifuse programming-that is, the fuse part of programmed bits cell will be short-circuited permanently so that their resistance will be close to 0 to achieve one-time-programming result.

In the programming operation 112, the selected bit cell (for example, the bottom-right bit cell in FIG. 1) is applied with programming voltage VDD through the connected source line SL2, and the connected bit line BL2 is grounded GND. At this moment, if the connected word line WL2 is applied with voltage that opens the transistor 103 of this bit cell, junction breakdown will occur in the anti-fuse 107 of bit cell due to overvoltage, so that the anti-fuse 107 would be permanently short-circuited 110, that is, the resistance of anti-fuse 107 is close to 0 and achieves one-time-programming result. In the reading operation, since the resistance of anti-fuse 107 is close to 0, the voltage difference read at the programmed bit cell is also close to 0, i.e. it is in low (L) state. On the other hand, the non-programmed bit cells are still provided with intrinsic resistance since their fuses are not subject to permanent junction breakdown, so that an appreciable voltage difference may be read at these bit cells, i.e. they are in high (H) state. The required one-time-programming result is achieved by making these bit cells permanently read in L state or H state in reading operation.

Figure 2:
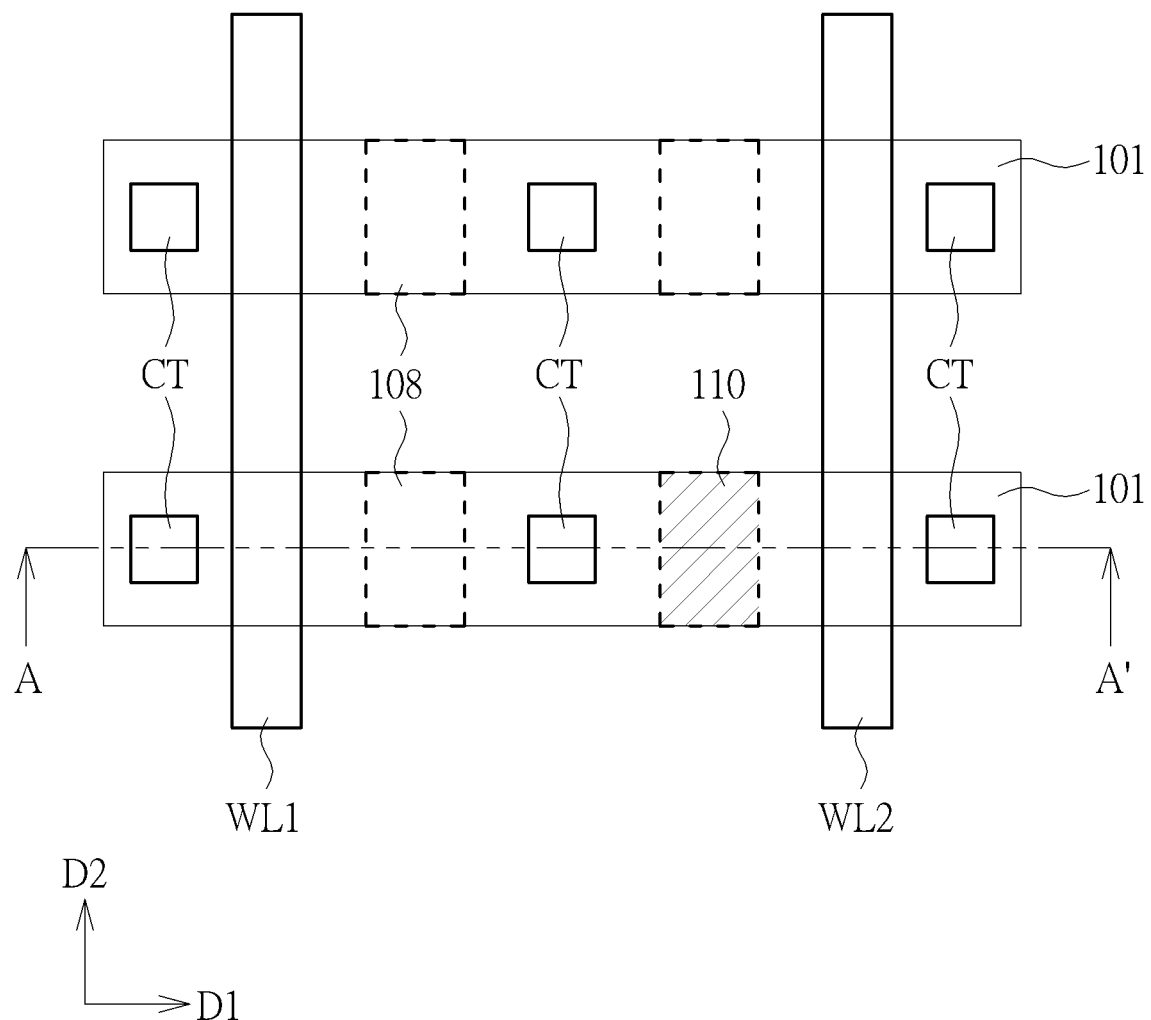
FIG. 2 is a schematic layout of the 2×2 bit cell structure in accordance with the preferred embodiment of the present invention.
Figure 3:
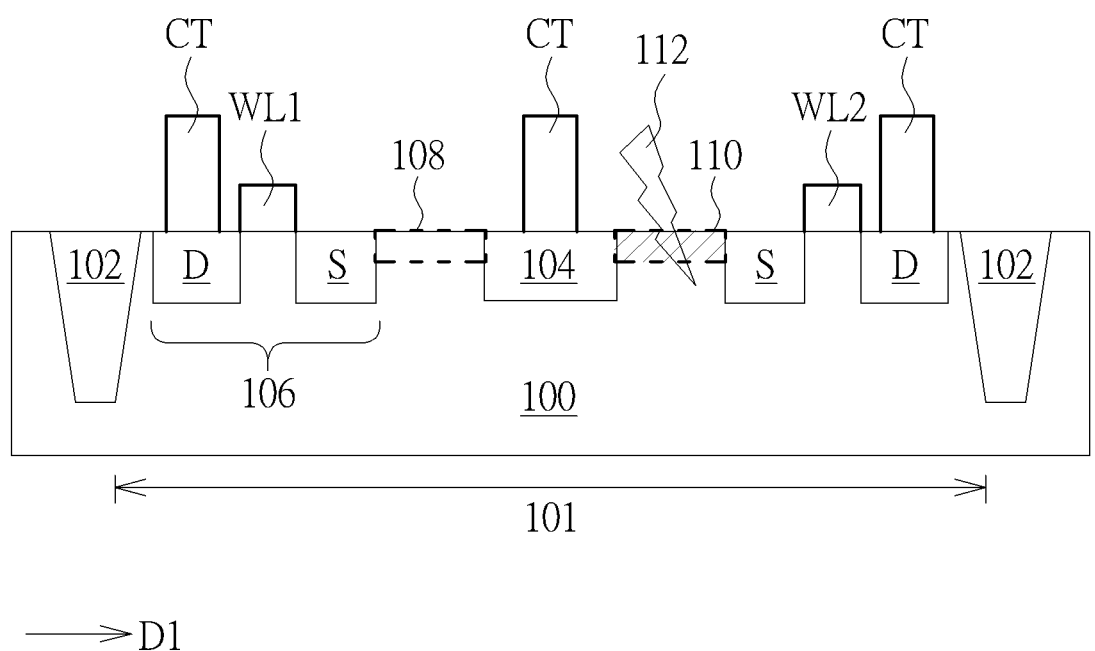
FIG. 3 is a cross-section of the bit cell structure in accordance with the preferred embodiment of the present invention.

Now, please refer collectively to FIG. 2 and FIG. 3, which are respectively schematic layout and cross-section taken along a section line A-A' in the schematic layout. The reader may understand the general circuit layout of bit cells in the present invention and their relative structural connections in the direction vertical to the substrate from these two figures. As shown in the figures, the bit cell structure of present invention is constructed on a substrate 100. The substrate 100 may be a silicon substrate. Doped wells, such as p-well, may be formed in the substrate in advance through implantation processes. Multiple active areas 101 are defined on the substrate 100, such as the active areas 101 extending in the first direction D1 in FIG. 2. Shallow trench isolations 102 are formed between the active areas 101 to provide electrical insulation. Word lines WL1, WL2 extend and traverse over plenty of active areas 101 in the second direction D2.

One active area 101 may include a number of bit cells and doped regions. For example, in the preferred embodiment of present invention, two bit cells share one active area 101 and one common source line (not shown), wherein each bit cell includes a first doped region 104 and a second doped region 106. The first doped region 104 and the second doped region 106 are electrically connected through a heavily doped channel region 108. The heavily doped channel region 108 and the second doped region 106 are respectively the part of antifuse for one-time-programming and the part of transistor 103 (see FIG. 1). Furthermore, the second doped region 106 is further provided with a source S and a drain D. Word lines WL1 or WL2 between the source S and the drain D are used to control the conduction therebetween. The first doped region 104 functions as a common source region for two bit cells at two sides and is electrically connected to the source line (not shown) in upper layers through a contact CT to receive electronic signal. In the condition that word lines WL1, WL2 open up the transistor, the received electronic signal from the first doped region 104 is transmitted to the drain D of second doped region 106 sequentially through the heavily doped channel region 108 and the source S of second doped region 106, and is electrically connected to the bit line (not shown) in upper layers through a contact CT.

In the embodiment of present invention, the aforementioned first doped region 104, source S and drain D may be lightly doped conductive region, which may be formed by doping n-type dopants like arsenic (As) or phosphorous (P) in the p-well of substrate 100 through ion implantation processes. In comparison thereto, the heavily doped channel region 108 is a heavily doped conductive region, such as a heavily doped n+ region, which means its doping concentration is far greater than the doping concentration of aforementioned lightly doped region. Due to heavy doping, the breakdown voltage of heavily doped channel region 108 would be less than the breakdown voltages of other doped regions. Therefore, the heavily doped channel region 108 may be designedly breakdown by applying moderate programming voltage to form permanent short-circuit 110 (with resistance close to 0), while the non-programmed heavily doped channel regions 108 remain intact (with intrinsic resistance). In the embodiment of present invention, the advantage of inducing one-time-programming effect using the heavily doped channel region 108 as an antifuse is that this approach is compatible to CMOS logic processes and requires no additional process steps and costs to form the antifuse part. Furthermore, the doping concentration of heavily doped channel region 108 may be adjusted to form an antifuse part that may be easily programmed, thereby solving the conventional problem of poor reliability and poor programming yield in high-density one-time programmable memory.

Figure 4:
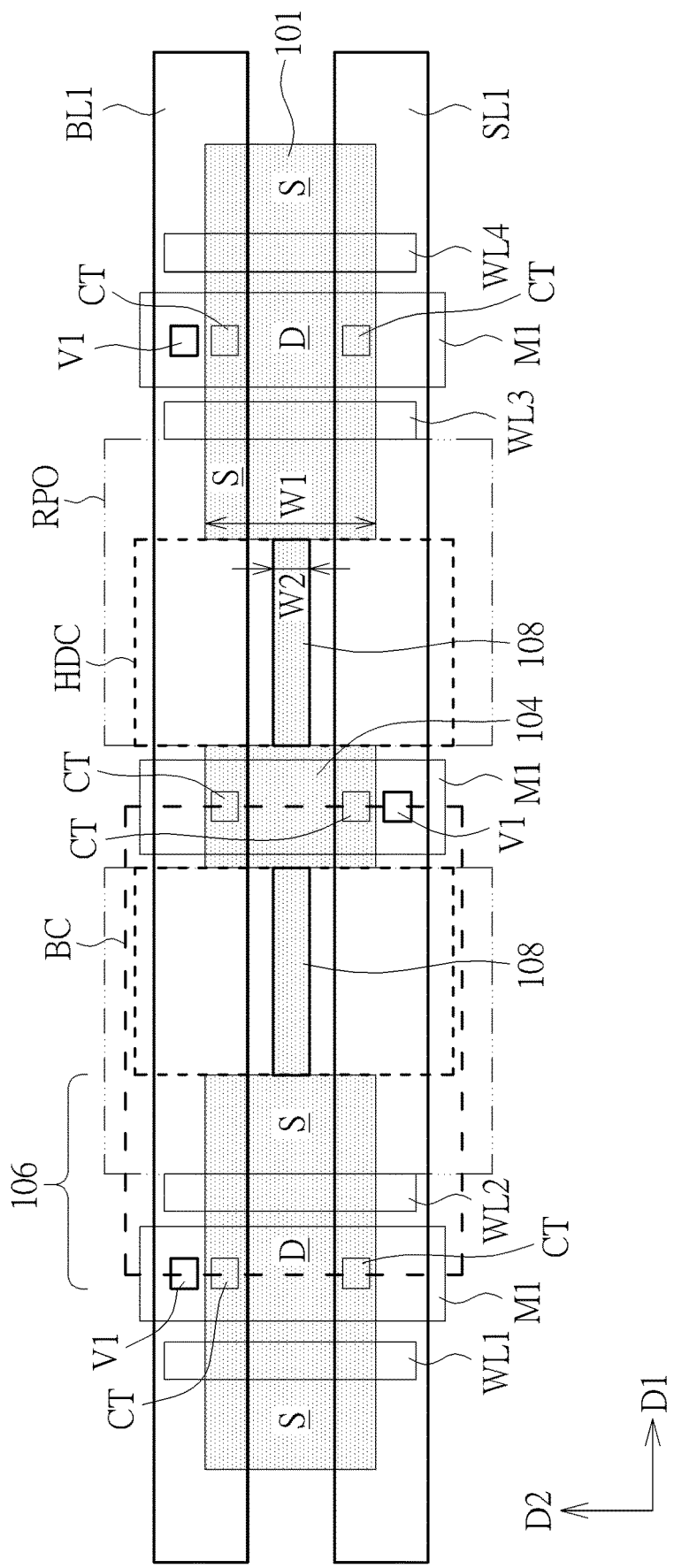
FIG. 4 is a realistic layout of the bit cell structure in accordance with the preferred embodiment of the present invention.

Please refer now to FIG. 4, which is a realistic layout of the bit cell structure in the preferred embodiment of present invention. This layout only shows one active area extending in the first direction D1, with one common first doped region 104 and two sides connected respectively to the source S in the second doped region 106 of two bit cells BC. The two bit cells BC are symmetrical about the first doped region 104.

The common first doped region 104 is first electrically connected to an upper first metal layer M1 through a contact CT and then electrically connected to a source line SL1 in a further upper second metal layer. In this embodiment, the width W2 of heavily doped channel region 108 in the second direction D2 is smaller than the width W1 of first doped region 104 and source S in the second direction D2. A heavily doped pattern HDC limits the region that will be subject to heavy doping on the substrate surface. The overlapping parts of the heavily doped pattern HDC and the active area 101 form the heavily doped channel region 108. The doping concentration of source S adjacent to the heavily doped channel region 108 is less than the doping concentration of heavily doped channel region 108. The source S and the heavily doped channel region 108 are both covered by a mask RPO to prevent metal silicide formed thereon in later processes. The selectively programmed heavily doped channel region 108 is short-circuited as described in previous embodiments. Trivial details are herein omitted.

Please refer still to FIG. 4. Word lines WL1-WL4 between the source S and the drain D of second doped region 106 function as gates. In this embodiment, drain D may be a common drain D for the bit cells BC at two sides, which are electrically connected to an upper first metal layer M1 through contacts CT and then electrically connected to a further upper bit line BL1 in the second metal layer M2 through a via V1. Please note that, although the source line SL1 is designedly parallel to the bit line BL1 in this embodiment, it is possible for the source line SL1 to be parallel to the word lines WL1-WL4 in other embodiments.

Figure 5:
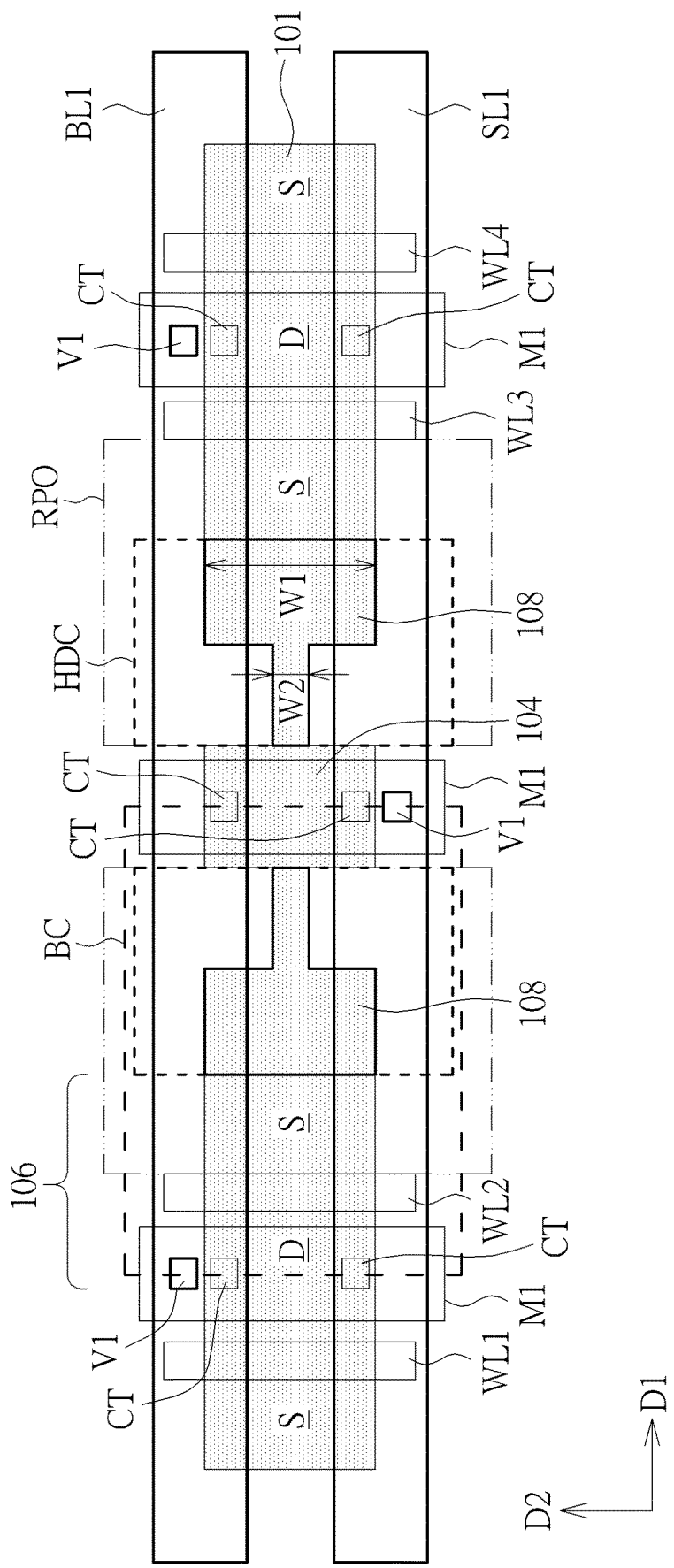
FIG. 5 is a realistic layout of the bit cell structure in accordance with another embodiment of the present invention.

Please refer now to FIG. 5, which is a realistic layout of the bit cell structure according to another embodiment of the present invention. The difference between this embodiment and the embodiment of FIG. 4 is that the heavily doped channel region 108 of this embodiment has different widths. As shown in FIG. 5, the (first) part of heavily doped channel region 108 close to and connecting the first doped region 104 has smaller width W2 in the second direction D2, while the (second) part of heavily doped channel region 108 close to and connecting the source S has larger width W1 in the second direction D2. Designing the channel close to the source line doped region (i.e. first doped region 104) with a width smaller than the one close to drain may improve the electrical performance of devices.

Figure 6:
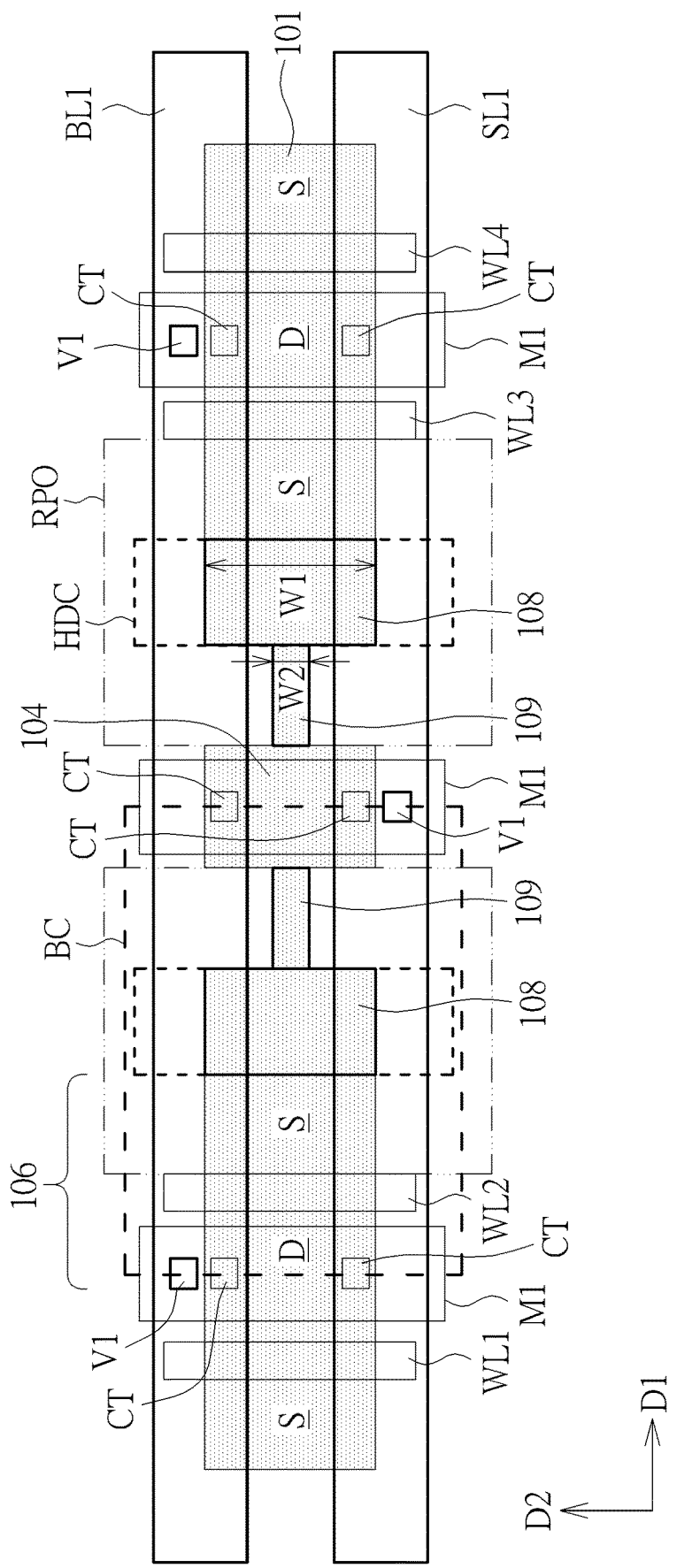
FIG. 6 is a realistic layout of the bit cell structure in accordance still another embodiment of the present invention.

Please refer now to FIG. 6, which is a realistic layout of the bit cell structure according to still another embodiment of the present invention. The difference between this embodiment and the embodiment of FIG. 5 is that the channel region of this embodiment has different doping concentrations. As shown in FIG. 6, in this embodiment, the heavily doped channel region 108 is limited to the end close to the source S and has larger width W1, while the part close to the end of first doped region 104 and has smaller width W2 is lightly doped channel region 109. The doping concentration of lightly doped channel region 109 is less than the doping concentration of heavily doped channel region 108, which is preferably equal to the doping concentration of first doped region 104 and/or source S. The heavily doped pattern HDC may only overlap the heavily doped channel region 108. The lightly doped channel region 109, the heavily doped channel region 108 and the source S are all covered by the mask RPO to prevent metal silicide formed thereon in later processes. In this way, the design of channel region with two different doping concentrations and widths may help to perform the programming and improve its reliability and yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bit cell structure for one-time-programming, comprising:
   a substrate;
   a first doped region in said substrate and electrically connected with a source line;
   a second doped region in said substrate and comprising a source and a drain, wherein said drain is electrically connected with a bit line;
   a doped channel region in said substrate and connected with said first doped region and said source of said second doped region, wherein said doped channel region has the same doping type as doping types of said first doped region and said source and said drain of said second doped region, and a doping concentration of said doped channel region is greater than doping concentrations of said first doped region and said source and said drain of said second doped region so that a breakdown voltage of said doped channel region is less than breakdown voltages of said first doped region and said source and said drain of said second doped region; and
   a word line traversing over said second doped region and between said source and said drain.

2. The bit cell structure for one-time-programming of claim 1, wherein said doped channel region extends in a first direction and with two ends connecting respectively to said first doped region and said source of said second doped region, and a width of said doped channel region in a second direction perpendicular to said first direction is less than a width of said first doped region in said second direction and is less than a width of said second doped region in said second direction.

3. The bit cell structure for one-time-programming of claim 2, wherein said source line and said bit line extend in said first direction, and multiple said source lines and said bit lines are alternatively set in said second direction.

4. The bit cell structure for one-time-programming of claim 2, wherein said source line and said word line extend in said second direction, and multiple said source lines and said word lines are alternatively set in said first direction.

5. The bit cell structure for one-time-programming of claim 1, wherein said doped channel region is an anti-fuse with a doping concentration set to be short-circuited by junction breakdown in an one-time-programming.

6. The bit cell structure for one-time-programming of claim 1, wherein said first doping region is electrically connected to a first metal layer above through a contact and further electrically connected to said source line further above in a second metal layer.

7. The bit cell structure for one-time-programming of claim 1, wherein said drain of said second doped region is first electrically connected to a first metal layer above through a contact and further electrically connected to said bit line further above in a second metal layer.

8. The bit cell structure for one-time-programming of claim 1, wherein said first doped region is shared by another bit cell structures, and said another bit cell structures and said bit cell structure are identical and are symmetrical about a median line of said first doped region.

* * * * *